(12) United States Patent
Kondo et al.

(10) Patent No.: US 12,347,649 B2
(45) Date of Patent: Jul. 1, 2025

(54) PLASMA PROCESSING APPARATUS AND LID MEMBER

(71) Applicant: Tokyo Electron Limited, Tokyo (JP)

(72) Inventors: Hiroshi Kondo, Fuchu (JP); Haruhiko Furuya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 422 days.

(21) Appl. No.: 17/819,055

(22) Filed: Aug. 11, 2022

(65) Prior Publication Data

US 2023/0058928 A1 Feb. 23, 2023

(30) Foreign Application Priority Data

Aug. 17, 2021 (JP) ................................. 2021-132803

(51) Int. Cl.
 *H01J 37/32* (2006.01)
(52) U.S. Cl.
 CPC .... *H01J 37/32192* (2013.01); *H01J 37/3244* (2013.01); *H01J 2237/166* (2013.01)
(58) Field of Classification Search
 CPC ............. H01J 37/3244; H01J 37/32192; H01J 2237/166
 See application file for complete search history.

(56) References Cited

U.S. PATENT DOCUMENTS

| | | | | |
|---|---|---|---|---|
| 2001/0010207 A1* | 8/2001 | Yamamoto | .......... | H01J 37/3244 118/723 MW |
| 2004/0099378 A1* | 5/2004 | Kim | .................... | C23C 16/4558 156/345.33 |
| 2008/0292811 A1* | 11/2008 | Choi | .................... | C23C 16/4401 427/255.28 |

FOREIGN PATENT DOCUMENTS

JP 2006-319042 A 11/2006
KR 10-2018-0116140 A 10/2018

* cited by examiner

*Primary Examiner* — Yuechuan Yu
(74) *Attorney, Agent, or Firm* — Armstrong Teasdale LLP

(57) ABSTRACT

A plasma processing apparatus includes: a processing container in which a stage is accommodated and including an opening formed above the stage; a lid member for sealing the opening and including: at least one through-hole formed in a region facing the stage and in which a radiation part for radiating microwaves is arranged; a protruded portion formed on a first surface facing an interior of the processing container to protrude toward the interior of the processing container along an edge of the opening; a flow path formed inside the protruded portion; gas holes formed on the first surface to communicate with the flow path; and a supply port formed on a second surface facing an exterior of the processing container to communicate with the flow path; and a remote plasma unit connected to the supply port and for plasmarizing a cleaning gas and supply the same to the supply port.

17 Claims, 5 Drawing Sheets

PLASMA PROCESSING APPARATUS AND LID MEMBER

CROSS-REFERENCE TO RELATED APPLICATION

This application is based upon and claims the benefit of priority from Japanese Patent Application No. 2021-132803, filed on Aug. 17, 2021, the entire contents of which are incorporated herein by reference.

TECHNICAL FIELD

The present disclosure relates to a plasma processing apparatus and a lid member.

BACKGROUND

Patent Document 1 discloses a configuration in which a remote plasma unit is arranged above a chamber (processing container), and a cleaning gas is plasmarized by the remote plasma unit and supplied into the chamber.

PRIOR ART DOCUMENT

Patent Document

Patent Document 1: Japanese Laid-Open Patent Publication No. 2006-319042

SUMMARY

According to one embodiment of the present disclosure, a plasma processing apparatus includes a processing container in which a stage on which a substrate is placed is accommodated and which includes an opening formed above the stage; a lid member configured to seal the opening of the processing container and including: at least one through-hole formed in a region facing the stage and in which a radiation part configured to radiate microwaves is arranged; a protruded portion formed on a first surface facing an interior of the processing container to protrude toward the interior of the processing container along an edge of the opening; a flow path formed inside the protruded portion; a plurality of first gas holes formed on the first surface to communicate with the flow path; and a supply port formed on a second surface facing an exterior of the processing container to communicate with the flow path; and a remote plasma unit connected to the supply port and configured to plasmarize a cleaning gas and supply the plasmarized cleaning gas to the supply port.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a plasma processing apparatus and a lid member disclosed herein will be described in detail with reference to the drawings. It should be noted that the present embodiment does not limit the disclosed plasma processing apparatus and lid member. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, as semiconductor products become highly dense and miniaturized, a plasma processing apparatus using microwaves for film formation processing has been used in a process of manufacturing semiconductor products. In such a plasma processing apparatus, a radiation part for radiating microwaves, such as a microwave radiation mechanism or the like, is arranged on a lid member that seals an upper surface of a processing container. The radiation part radiates microwaves into the processing container to generate plasma. By using the microwaves, the plasma processing apparatus can stably generate plasma even in a high vacuum state in which pressure is relatively low. Further, the plasma processing apparatus can generate high-density plasma by using the microwaves.

By the way, in the plasma processing apparatus, when a film forming process is performed, deposits are deposited on a surface of a structure inside the processing container, such as an inner wall surface of the processing container or the like. Therefore, it is conceivable to supply a cleaning gas plasmarized by a remote plasma unit into the processing container to perform cleaning to remove the deposits. The cleaning gas plasmarized by the remote plasma unit is deactivated in the middle when a flow path becomes long. As a result, in the related art, the remote plasma unit is arranged on an upper portion of the processing container such as on the lid member or the like in order to shorten the flow path through which the plasmarized cleaning gas flows. However, since the radiation part is arranged on the upper portion of the processing container in the plasma processing apparatus using microwaves, the remote plasma unit cannot be arranged on the upper portion of the processing container. Therefore, there has been a demand for a technique capable of performing cleaning with remote plasma even when the radiation part for radiating microwaves is arranged on the upper portion of the processing container.

Embodiment

Figure 1:
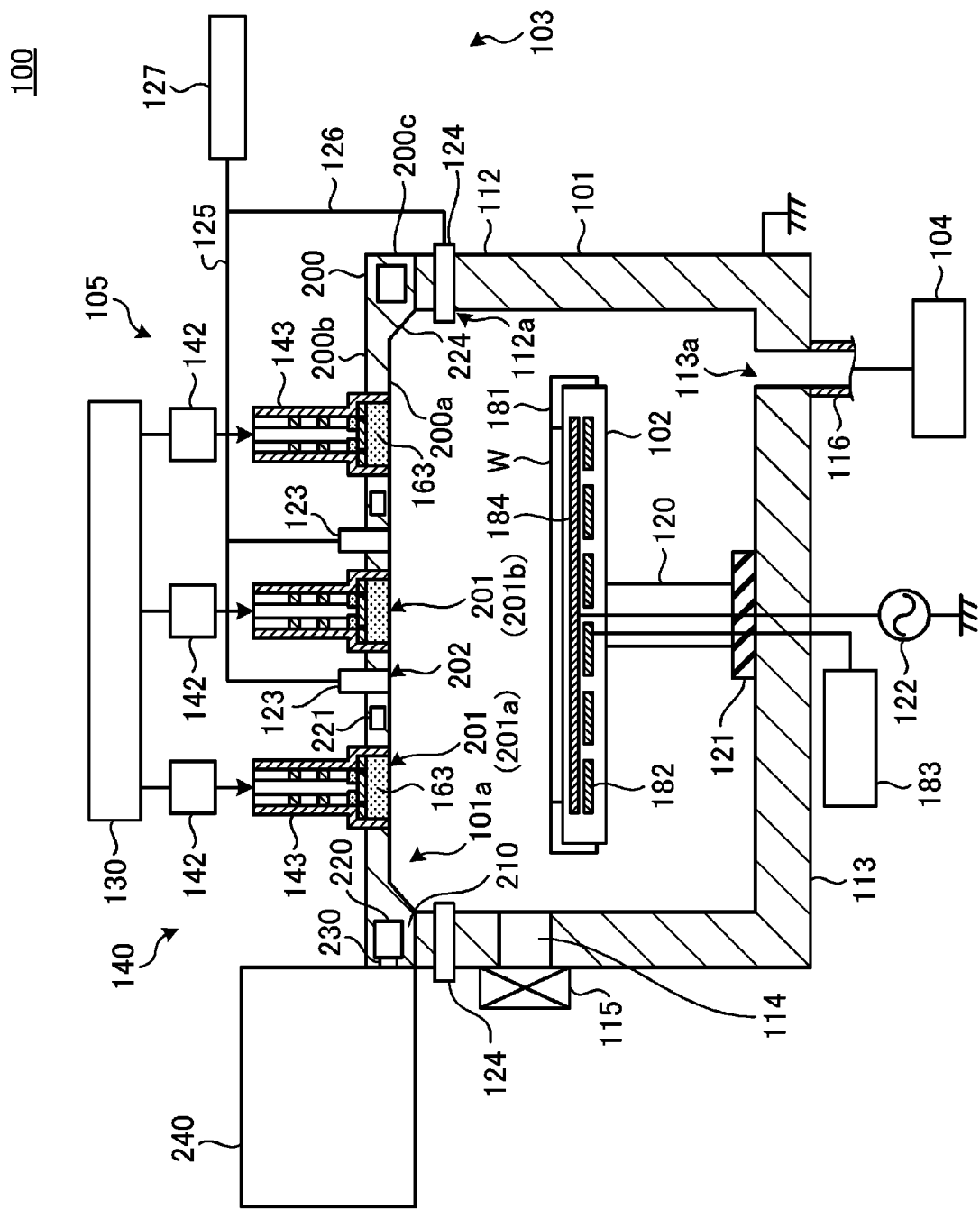
FIG. 1 is a cross-sectional view schematically showing an example of a plasma processing apparatus according to an embodiment.

An example of the plasma processing apparatus according to the present disclosure will be described. FIG. 1 is a cross-sectional view schematically showing an example of a plasma processing apparatus 100 according to an embodiment. The plasma processing apparatus 100 shown in FIG. 1 includes a processing container 101, a stage 102, a gas supply mechanism 103, an exhaust device 104, and a microwave introduction device 105.

The processing container 101 accommodates a substrate W such as a semiconductor wafer or the like. The stage 102 is provided inside the processing container 101. The substrate W is placed on the stage 102. The gas supply mechanism 103 supplies a gas into the processing container 101. The exhaust device 104 exhausts a gas from an interior of the processing container 101. The microwave introduction device 105 generates microwaves for generating plasma inside the processing container 101, and also introduces the microwaves into the processing container 101.

The processing container 101 is made of a metallic material such as aluminum or an alloy thereof, and is formed in a substantially cylindrical shape. The processing container 101 includes a plate-shaped top wall portion 200, a plate-shaped bottom wall portion 113, and a sidewall portion 112 that connects the top wall portion 200 and the bottom wall portion 113. The processing container 101 is configured such that the top wall portion 200 constituting the upper surface of the processing container 101 is removable. The processing container 101 includes an opening 110a formed on the upper side of the stage 102. The top wall portion 200 is formed in a shape corresponding to the opening 101a of the processing container 101, and is configured to seal the opening 101a. In the embodiment, the top wall portion 200 corresponds to the lid member according to the present disclosure. The inner wall of the processing container 101 includes a protective film formed by being coated with yttria ($Y_2O_3$) or the like. The microwave introduction device 105 is provided on the upper portion of the processing container 101, and is configured to introduce electromagnetic waves (microwaves) into the processing container 101 to generate plasma. The microwave introduction device 105 will be described in detail later.

The top wall portion 200 includes a plurality of through-holes 201 and 202 into which microwave radiation mechanisms 143 and gas introduction nozzles 123 of the microwave introduction device 105 are fitted. The sidewall portion 112 includes a loading/unloading port 114 through which the substrate W is loaded into and unloaded from a transfer chamber (not shown) adjacent to the processing container 101. Further, in the sidewall portion 112, a gas introduction nozzle 124 is provided at a position above the stage 102. The loading/unloading port 114 is opened and closed by a gate valve 115.

The bottom wall portion 113 is provided with an opening 113a, and the exhaust device 104 is provided via an exhaust pipe 116 connected to the opening 113a. The exhaust device 104 includes a vacuum pump and a pressure control valve. The interior of the processing container 101 is exhausted through the exhaust pipe 116 by the vacuum pump of the exhaust device 104. An internal pressure of the processing container 101 is controlled by the pressure control valve of the exhaust device 104.

The stage 102 is formed in a disk shape. The stage 102 is made of a metallic material, for example, aluminum or the like whose surface is anodized, or a ceramic material, for example, aluminum nitride (AlN) or the like. The substrate W is placed on an upper surface of the stage 102. The stage 102 is supported by a support member 120 and a base member 121 formed in a cylindrical shape and made of ceramics such as AlN or the like so as to extend upward from the center of the bottom of the processing container 101. A guide ring 181 for guiding the substrate W is provided on an outer edge of the stage 102. Further, inside the stage 102, lift pins (not shown) for raising and lowering the substrate W are provided so as to move upward and downward with respect to the upper surface of the stage 102.

Further, a heater 182 is embedded in the stage 102. The heater 182 heats the substrate W placed on the stage 102 by being supplied with electric power from a heater power source 183. Further, a thermocouple (not shown) is inserted into the stage 102. A heating temperature of the substrate W may be controlled based on a signal from the thermocouple. Further, in the stage 102, an electrode 184 having substantially the same size as the substrate W is embedded above the heater 182. A high-frequency bias power source 122 is electrically connected to the electrode 184. The high-frequency bias power source 122 applies high-frequency bias for drawing ions to the stage 102. The high-frequency bias power source 122 may not be provided depending on the characteristics of plasma processing.

The gas supply mechanism 103 supplies various gases into the processing container 101. The gas supply mechanism 103 includes gas introduction nozzles 123 and 124, gas supply pipes 125 and 126, and a gas supplier 127. The gas introduction nozzle 123 is fitted into a through-hole 202 formed in the top wall portion 200 of the processing container 101. The gas introduction nozzle 124 is fitted into a through-hole 112a formed in the sidewall portion 112 of the processing container 101. The gas supplier 127 is connected to each gas introduction nozzle 123 via the gas supply pipe 125. Further, the gas supplier 127 is connected to each gas introduction nozzle 124 via the gas supply pipe 126. The gas supplier 127 includes sources of various gases. Further, the gas supplier 127 is provided with on-off valves for starting and cutting off the supply of various gases, and flow rate adjustment parts for adjusting flow rates of the gases. For example, when a film forming process is carried out, the gas supplier 127 supplies a processing gas containing a film forming material. Further, when plasma cleaning is performed, the gas supplier 127 supplies a cleaning gas.

The microwave introduction device 105 is provided above the processing container 101. The microwave introduction device 105 introduces electromagnetic waves (microwaves) into the processing container 101 to generate plasma.

The microwave introduction device 105 includes a top wall portion 200 of the processing container 101, a microwave output part 130, and an antenna unit 140. The top wall portion 200 functions as a top plate of the processing container 101. The microwave output part 130 generates microwaves, and distributes and outputs the microwaves to a plurality of paths. The antenna unit 140 introduces the microwaves outputted from the microwave output part 130 into the processing container 101.

The microwave output part 130 includes a microwave power source, a microwave oscillator, an amplifier, and a distributor. The microwave oscillator is in a solid state and oscillates (e.g., PLL-oscillates) the microwaves at, for example, 860 MHz. A frequency of the microwaves is not limited to 860 MHz, and may be in the range of 700 MHz to 10 GHz such as 2.45 GHz, 8.35 GHz, 5.8 GHz, 1.98 GHz, or the like. The amplifier amplifies the microwaves oscillated by the microwave oscillator. The distributor distributes the microwaves amplified by the amplifier to a plurality of paths. The distributor distributes the microwaves while matching impedances on the input side and the output side.

The antenna unit 140 includes a plurality of antenna modules. FIG. 1 shows three antenna modules of the antenna unit 140. Each antenna module includes an amplifier 142 and a microwave radiation mechanism 143. The microwave output part 130 generates microwaves, distributes the microwaves, and outputs the microwaves to each antenna module.

The amplifier 142 of the antenna module mainly amplifies the distributed microwaves and outputs the same to the microwave radiation mechanism 143. The microwave radiation mechanism 143 is provided on the top wall portion 200. The microwave radiation mechanism 143 radiates the microwaves outputted from the amplifier 142 into the processing container 101.

The amplifier 142 includes a phase shifter, a variable gain amplifier, a main amplifier, and an isolator. The phase shifter changes a phase of the microwaves. The variable gain amplifier adjusts a power level of the microwaves to be inputted to the main amplifier. The main amplifier is configured as a solid state amplifier. The isolator separates reflected microwaves that move toward the main amplifier after being reflected by the antenna part of the microwave radiation mechanism 143 described later.

As shown in FIG. 1, each of the plurality of microwave radiation mechanisms 143 is arranged on the top wall portion 200. The microwave radiation mechanism 143 includes a cylindrical outer conductor and an inner conductor provided inside the outer conductor coaxially with the outer conductor. Further, the microwave radiation mechanism 143 includes a coaxial tube having a microwave transmission path and an antenna part for radiating microwaves into the processing container 101, both of which are arranged between the outer conductor and the inner conductor. A microwave transmission plate 163 is provided on a lower surface side of the antenna part. The lower surface of the microwave transmission plate 163 is exposed to the internal space of the processing container 101. The microwaves transmitted through the microwave transmission plate 163 generate plasma in the internal space of the processing container 101.

Figure 2:
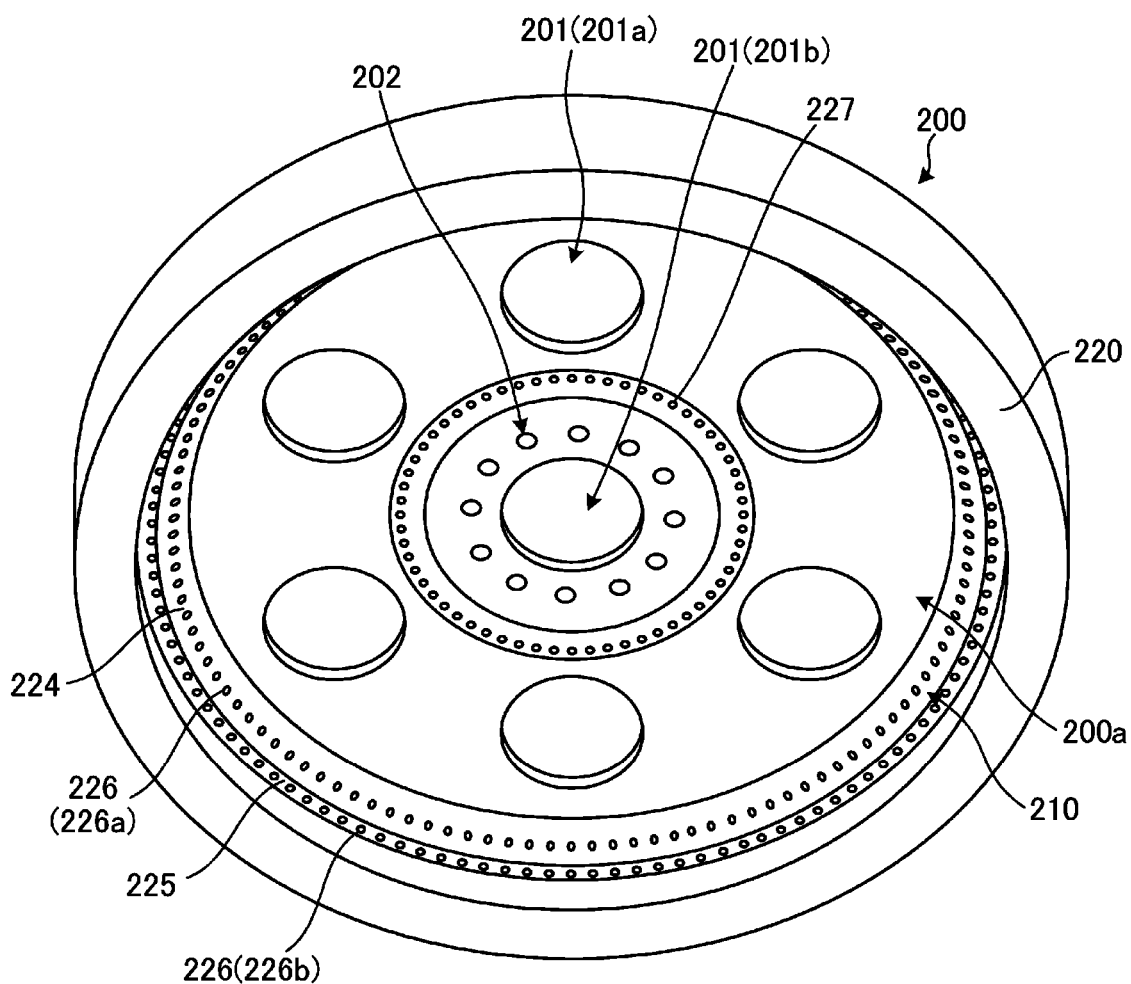
FIG. 2 is a diagram showing an example of a configuration of a top wall portion according to an embodiment.

FIG. 2 is a diagram showing an example of a configuration of the top wall portion 200 according to an embodiment. In FIG. 2, there is depicted a perspective view showing a lower surface 200a of the top wall portion 200 that faces the interior of the processing container 101. As shown in FIG. 2, the top wall portion 200 is provided with seven through-holes 201 in which the microwave radiation mechanisms 143 of the antenna module are arranged. In the top wall portion 200, six through-holes 201a are arranged to be the vertices of a regular hexagon, and one through-hole 201b is further arranged at the center position of the regular hexagon. The seven through-holes 201 are arranged so that the adjacent through-holes 201 are evenly spaced apart from each other. The microwave radiation mechanism 143 is arranged in each of the seven through-holes 201. As a result, the microwave radiation mechanisms 143 are arranged at equal intervals in the top wall portion 200. Further, in the top wall portion 200, a plurality of through-holes 202 is arranged so as to surround the periphery of the central through-hole 201b. The plurality of gas introduction nozzles 123 of the gas supply mechanism 103 is fitted into the plurality of through-holes 202, respectively. The number of antenna modules provided on the top wall portion 200 is not limited to seven.

Here, the flow of film formation will be briefly described. In the plasma processing apparatus 100, the substrate W is placed on the stage 102. The plasma processing apparatus 100 performs a film forming process on the substrate W placed on the stage 102. For example, the plasma processing apparatus 100 applies bias power from the high-frequency bias power source 122 to the stage 102. Further, the plasma processing apparatus 100 introduces microwaves from the microwave introduction device 105 into the processing container 101 to generate plasma while supplying a processing gas containing a film forming material into the processing container 101 from the gas supplier 127, whereby a silicon-containing film is formed on the substrate W.

When the plasma processing apparatus 100 performs a film forming process, deposits are deposited on the surface of a structure inside the processing container 101. Therefore, the plasma processing apparatus 100 performs plasma cleaning in which plasma is generated to remove deposits while supplying a cleaning gas into the processing container 101.

Here, the plasma cleaning using the microwaves supplied from the microwave introduction device 105 has strong attack characteristics and may cause damage to internal members of the processing container 101. On the other hand, the plasma cleaning using remote plasma has weak attack characteristics and can suppress damage to the internal members of the processing container 101. Therefore, the plasma processing apparatus 100 according to the present embodiment has the following configuration in order to make it possible to perform the plasma cleaning by remote plasma.

As shown in FIG. 1, the top wall portion 200 is formed in a shape corresponding to the opening 101a of the processing container 101. In the present embodiment, the processing container 101 is formed in a substantially cylindrical shape, and the opening 101a is formed in a circular shape on the upper side of the processing container 101. The top wall portion 200 is formed in a circular shape corresponding to the opening 101a of the processing container 101. The top wall portion 200 seals the opening 101a of the processing container 101.

As shown in FIGS. 1 and 2, in the top wall portion 200, the central portion of the lower surface 200a facing the interior of the processing container 101 is formed to be substantially flat. In the top wall portion 200, a through-hole 201 in which the microwave radiation mechanism 143 of the antenna module is arranged is formed in a region of the central portion of the lower surface 200a facing the stage 102. Further, in the top wall portion 200, a protruded portion 210 that protrudes inward of the processing container 101 along an edge of the opening 101a is formed on the lower surface 200a. The protruded portion 210 is formed in an annular shape so as to surround the central portion of the lower surface 200a.

Figure 3:
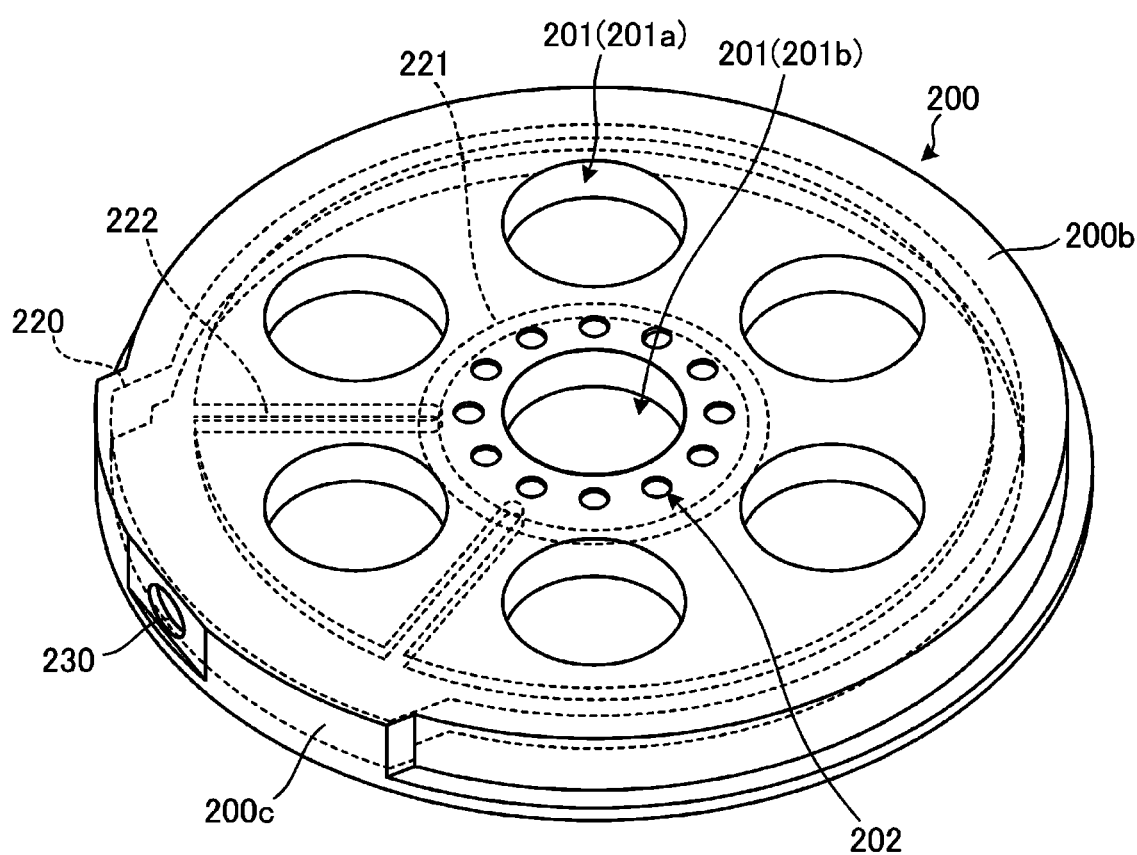
FIG. 3 is a diagram showing an example of the configuration of the top wall portion according to the embodiment.

FIG. 3 is a diagram showing an example of the configuration of the top wall portion 200 according to an embodiment. In FIG. 3, there is depicted a perspective view showing the upper surface 200b and the side surface 200c of the top wall portion 200 facing the exterior of the processing container 101. Further, in FIG. 3, an internal configuration of the top wall portion 200 is indicated by broken lines. As indicated by the broken lines, the top wall portion 200 includes a flow path 220 formed inside the protruded portion 210. The flow path 220 is formed in an annular shape inside the protruded portion 210 along the protruded portion 210. By providing the protruded portion 210, the top wall portion 200 can be formed so that the flow path 220 has a large cross section. For ease of machining, the flow path 220 is formed to have a rectangular cross section by combining substantially flat inner surfaces. This makes it possible to increase the cross section of the flow path 220. Further, even when a hole diameter of the gas hole 226 is made large on the side of the processing container 101 as will be described later, it is possible to increase the cross-sectional area of the flow path 220 while ensuring the minimum wall thickness for forming the gas hole 226 having such a shape. In the top wall portion 200, by enlarging the cross section of the flow path 220 in this way, it is possible to improve the flow of the plasmarized cleaning gas and suppress the deactivation of the plasmarized cleaning gas.

A supply port 230 communicating with the flow path 220 is formed on the surface of the top wall portion 200 facing the exterior of the processing container 101. In the present embodiment, the supply port 230 communicating with the flow path 220 is formed on the side surface 200c of the top wall portion 200. A portion of the top wall portion 200 where the supply port 230 is formed is expanded to the outer peripheral side. The flow path 220 is also expanded to the outer peripheral side at the portion where the supply port 230 is formed.

In the top wall portion 200, a central flow path communicating with the flow path 220 is formed inside the central portion of the lower surface 200a surrounded by the protruded portion 210. In the present embodiment, a flow path 221 is formed inside the central portion as the central flow path. The flow path 221 is formed in an annular shape so as to surround the through-hole 201b. Further, in the present embodiment, a flow path 222 connecting the flow path 220 and the flow path 221 is formed as the central flow path. In the preset embodiment, two flow paths 222 are formed. The flow path 221 and the flow path 222 are formed to have a rectangular cross section in order to increase the internal volume.

As shown in FIG. 1, a remote plasma unit 240 is connected to the supply port 230. A cleaning gas is supplied to the remote plasma unit 240 at the time of cleaning. The remote plasma unit 240 plasmarizes the supplied cleaning gas and supplies the same to the supply port 230. The plasmarized cleaning gas flows from the supply port 230 into the flow path 220, and flows from the flow path 220 to the flow paths 222 and 221.

Figure 4:
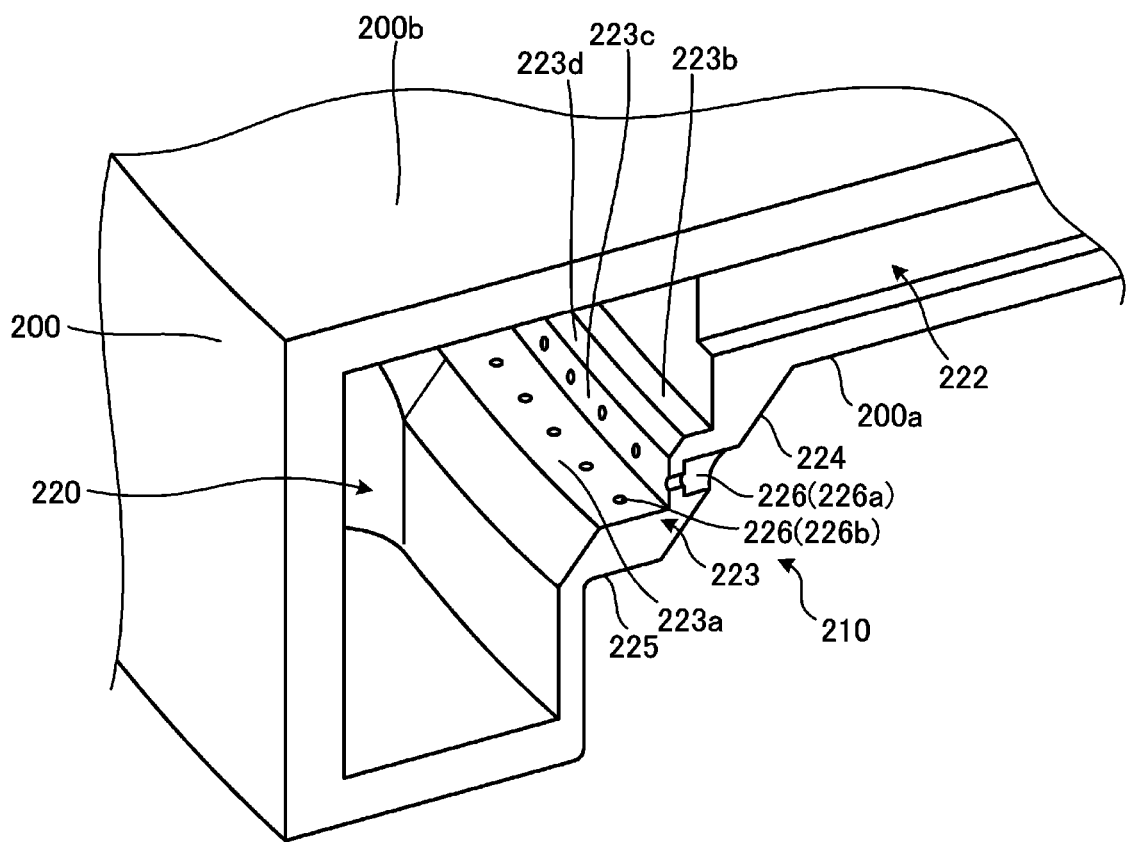
FIG. 4 is an enlarged view showing an example of the configuration of the top wall portion according to the embodiment.

FIG. 4 is an enlarged view showing an example of the configuration of the top wall portion 200 according to an embodiment. In FIG. 4, there is shown an internal configuration of the flow path 220 at a portion expanded to the outer peripheral side near the supply port 230 of the top wall portion 200. The flow path 220 has a stepped portion 223 formed on the inner wall on the lower surface 200a side. The stepped portion 223 is configured to include two surfaces 223a and 223b having different heights and a vertical surface 223c arranged between the surfaces 223a and 223b. In the present embodiment, an inclined surface 223d is further formed between the surfaces 223c and 223b of the stepped portion 223.

As shown in FIGS. 1, 2 and 4, in the top wall portion 200, an inclined surface 224 inclined toward the interior of the processing container 101 with respect to the central portion of the lower surface 200a surrounded by the protruded portion 210 is formed at the protruded portion 210. Further, an angle change of a predetermined angle or more at which the propagation of surface waves is suppressed is made on the lower surface 200a of the top wall portion 200. For example, in the top wall portion 200, a flat surface 225 is formed on a surface connected to the inner surface of the processing container 101 at an angle equal to or larger than a predetermined angle at which the propagation of surface waves is suppressed. The flat surface 225 is an example in which an angle change of a predetermined angle or more is made on the lower surface 200a. In the present embodiment, the flat surface 225 is formed outside the inclined surface 224. The flat surface 225 is formed so as to be perpendicular to the sidewall portion 112. By forming the flat surface 225 in this way, it is possible to prevent the surface waves propagating from the central portion of the top wall portion 200 from propagating to the sidewall portion 112 of the processing container 101 during plasma processing. By providing a surface corresponding to the flat surface 225 so that the angle formed by the flat surface 225 and the sidewall portion 112 becomes an acute angle, it is possible to further prevent the surface waves from propagating to the sidewall portion 112 of the processing container 101.

As shown in FIGS. 2 and 4, in the top wall portion 200, a plurality of gas holes 226 communicating with the flow path 220 is formed in the protruded portion 210 of the lower surface 200a facing the interior of the processing container 101. The gas holes 226 are formed so as to penetrate two surfaces constituting the stepped portion 223 in two directions with respect to the inclined surface 224. According to the present embodiment, in the top wall portion 200, gas holes 226a penetrating in a substantially horizontal direction and gas holes 226b penetrating in a substantially vertical direction are arranged side by side along the protruded portion 210. The gas holes 226a and the gas holes 226b are alternately provided one by one in a staggered manner so that the positions of the gas holes 226a and the gas holes 226b do not overlap in the circumferential direction. The gas holes 226a are provided side by side on the inclined surface 224 of the protruded portion 210 to penetrate the surface 223c constituting the stepped portion 223. The gas holes 226b are provided side by side on the flat surface 225 of the protruded portion 210 to penetrate the horizontal surface 223a constituting the stepped portion 223. As described above, in the top wall portion 200, by providing the substantially horizontal gas holes 226a on the vertical surface 223c of the stepped portion 223 and providing the substantially vertical gas holes 226b on the horizontal surface 223a of the stepped portion 223, it is possible to easily perform machining to form the gas holes 226a and 226b.

The gas holes 226a inject the cleaning gas inside the flow path 220 toward the center. The gas holes 226b inject the cleaning gas inside the flow path 220 downward. The gas holes 226 (226a and 226b) are formed to have a large diameter on the lower surface 200a side. As a result, the hole diameter of the gas holes 226 becomes larger on the processing container 101 side. Therefore, the injected cleaning gas is easily diffused and abnormal discharge in the gas holes 226 is suppressed. Further, in the top wall portion 200, by providing the gas holes 226a and the gas holes 226b in a staggered manner, it is possible to inject the cleaning gases with less influence on each other.

Further, as shown in FIG. 2, in the top wall portion 200, a plurality of gas holes 227 communicating with the flow path 221 is formed in the central portion of the lower surface 200a of the processing container 101. The gas holes 227 are formed so as to penetrate in the direction perpendicular to the lower surface 200a. The gas holes 227 inject the cleaning gas in the flow path 221 downward. Like the gas holes 226, the gas holes 227 are also formed to have a larger diameter on the lower surface 200a side. As a result, the hole diameter of the gas holes 227 becomes larger on the processing container 101 side. Therefore, the injected cleaning gas is easily diffused and abnormal discharge in the gas holes 227 is suppressed.

In the top wall portion 200, the plasmarized cleaning gas is supplied to the flow path 220 from one supply port 230. Therefore, in the top wall portion 200, if the gas holes 226 and the gas holes 227 are uniformly arranged with the same hole diameter, an amount of cleaning gas injected on the side of the supply port 230 increases, and the distribution of the cleaning gas in the processing container 101 becomes non-uniform. Thus, it is conceivable to change the hole diameters of the gas holes 226 and 227 according to the positions of the gas holes 226 and 227 to make the injection of the cleaning gas uniform. However, since a tolerance exists in the processing accuracy of the gas holes 226 and 227, it is difficult to make the injection of the cleaning gas uniform by changing the hole diameters of the gas holes 226 and 227.

Therefore, in the top wall portion 200, the intervals between the gas holes 226 and 227 are changed so that the plasmarized cleaning gas supplied to the supply port 230 is evenly injected from the gas holes 226 and 227 into the processing container 101. In the top wall portion 200, the gas holes 226 and the gas holes 227 are densely arranged on the opposite side of the supply port 230. As a result, in the top wall portion 200, it is possible to make the injection of the cleaning gas uniform.

Next, the flow of plasma cleaning will be briefly described. The plasma processing apparatus 100 performs plasma cleaning at the execution timing of plasma cleaning, such as each time when a predetermined number of substrates W is subjected to film formation or each time when film formation is performed at a predetermined cumulative film thickness. When performing the plasma cleaning, the plasma processing apparatus 100 adjusts the internal pressure of the processing container 101 to a predetermined pressure suitable for the plasma cleaning. Then, the plasma processing apparatus 100 supplies the cleaning gas to the remote plasma unit 240. The cleaning gas is plasmarized by the remote plasma unit 240 and supplied to the top wall portion 200 from the supply port 230. The cleaning gas supplied to the supply port 230 flows through the flow path 220, and flows from the flow path 220 to the flow paths 222 and 221. The cleaning gas is injected from the gas holes 226 and the gas holes 227 into the processing container 101. In the plasma processing apparatus 100, the plasma cleaning inside the processing container 101 is executed by the cleaning gas supplied from the top wall portion 200.

Here, in the plasma processing apparatus 100 according to the present embodiment, the microwave introduction devices 105 such as the microwave radiation mechanisms 143 or the like are arranged side by side in the upper portion of the apparatus and the processing gas is introduced between the microwave radiation mechanisms 14. These layouts are important in the film forming process and thus are not easy to change.

On the other hand, in the plasma processing apparatus 100 according to the present embodiment, by using the top wall portion 200, the cleaning by remote plasma can be performed without affecting the layouts of the microwave introduction device 105 or the like arranged on the upper portion of the processing container 101.

In the above-described embodiment, the case in which the flat surface 225 is formed outside the inclined surface 224 has been described by way of example. However, the present disclosure is not limited thereto. The flat surface 225 may be provided inward of the inclined surface 224 or in the middle of the inclined surface 224. Further, the top wall portion 200 may have a configuration in which the inclined surface 224 is connected to the sidewall portion 112 without providing the flat surface 225.

Further, in the above-described embodiment, the case in which the diameters of the gas holes 226 and the gas holes 227 become larger on the side of the lower surface 200a has been described by way of example. However, the present disclosure is not limited thereto. For example, one or both of the gas holes 226 and the gas holes 227 may be formed to have a substantially constant diameter.

Figure 5:
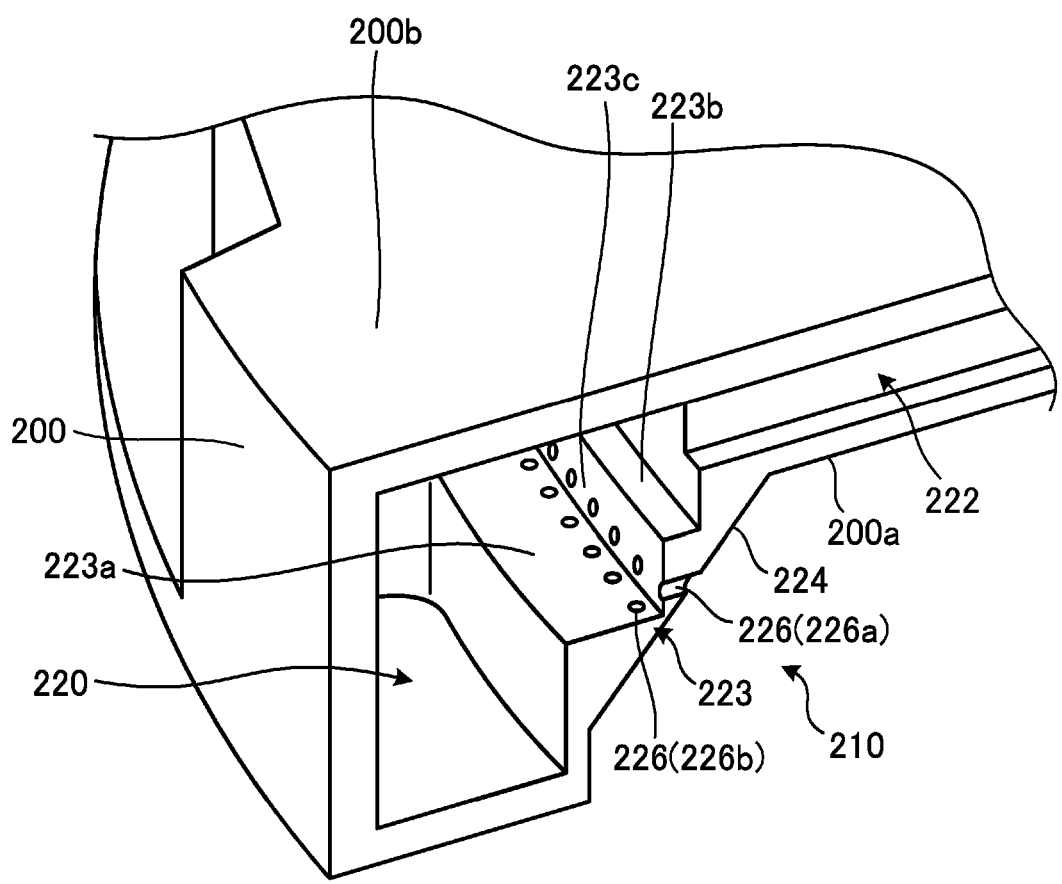
FIG. 5 is an enlarged view showing another example of the configuration of the top wall portion according to an embodiment.

FIG. 5 is an enlarged view showing another example of the configuration of the top wall portion 200 according to an embodiment. In FIG. 5, there is shown an internal configuration of the flow path 220 at a portion expanded to the outer peripheral side near the supply port 230 of the top wall portion 200. In the top wall portion 200 shown in FIG. 5, the inclined surface 224 is configured to be connected to a surface substantially flush with the sidewall portion 112. Further, in the top wall portion 200 shown in FIG. 5, the gas holes 226 are formed to have a substantially constant diameter.

Further, in the above-described embodiment, the case in which the supply port 230 is formed on the side surface 200c of the processing container 101 has been described by way of example. However, the present disclosure is not limited thereto. The supply port 230 may be provided in a peripheral region that does not overlap with the microwave radiation mechanism 143 on the upper surface 200b.

As described above, the plasma processing apparatus 100 according to the embodiment includes the processing container 101, the top wall portion 200 (lid member), and the remote plasma unit 240. The stage 102 on which the substrate W is placed is arranged inside the processing container 101. The opening 101a is formed above the stage 102. The top wall portion 200 seals the opening 101a of the processing container 101. In the top wall portion 200, one or more through-holes 201 in which the microwave radiation mechanism 143 (radiation part) for radiating microwaves is arranged are formed in the region facing the stage 102. The protruded portion 210 protruding toward the interior of the processing container 101 is formed along the edge of the opening 101a on the lower surface 200a (first surface) facing the interior of the processing container 101. The flow path 220 is formed inside the protruded portion 210. The plurality of gas holes communicating with the flow path 220 is formed on the lower surface 200a. The supply port 230 communicating with the flow path 220 is formed on the upper surface 200b or the side surface 200c (second surface) facing the exterior of the processing container 101. The remote plasma unit 240 is connected to the supply port 230 and is configured to plasmarize the cleaning gas and supply the plasmarized cleaning gas to the supply port 230. As a result, the plasma processing apparatus 100 can perform cleaning with remote plasma even when the radiation part is arranged on the upper portion of the processing container 101. Further, in the plasma processing apparatus 100, the cross section of the flow path 220 can be made large by providing the protruded portion 210. Thus, the flow of the plasmarized cleaning gas becomes good, which makes it possible to suppress the deactivation of the plasmarized cleaning gas.

Further, in the top wall portion 200, the inclined surface 224 inclined toward the interior of the processing container 101 is formed on the protruded portion 210 with respect to the central portion of the lower surface 200a surrounded by the protruded portion 210. The plurality of gas holes 226 is formed on the inclined surface 224. By forming the inclined surface 224 in the protruded portion 210 of the top wall portion 200 with respect to the central portion in this way, the shape of the holes seen from the direction of the opening 101a of the processing container 101 can be made elliptical, and the gas can be easily diffused in the processing container 101. Further, by forming the plurality of gas holes 226 on the inclined surface 224, the radicals of the cleaning gas can be irradiated at any angle from the horizontal direction to the vertical direction. As a result, the radicals can be irradiated to the arrangement region of the microwave radiation mechanisms 143 on the lower surface 200a of the top wall portion 200, the stage 102, and the sidewall and bottom surface of the processing container 101.

In the top wall portion 200, the gas holes 226 are arranged side by side in at least two directions with respect to the inclined surface 224. As a result, the cleaning gas can be injected into the processing container 101 in a plurality of directions, and the cleaning gas can be quickly diffused in the processing container 101.

Further, in the top wall portion 200, the stepped portion 223 is formed on the inner wall of the flow path 220 on the side of the lower surface 200a, and the gas holes 226 (226a and 226b) are provided in two directions with respect to the inclined surface 224 so as to penetrate the two surfaces (the surfaces 223a and 223c) constituting the stepped portion 223. This makes it possible to easily perform machining to form the gas holes 226.

Further, the angle change of a predetermined angle or more at which the propagation of surface waves is suppressed is made on the lower surface 200a of the top wall portion 200. Further, in the top wall portion 200, the flat surface 225 is formed on the surface connected to the inner surface of the processing container 101 at the angle equal to or larger than the predetermined angle at which the propagation of surface waves is suppressed. As a result, it is possible to prevent the surface waves propagating from the central portion of the top wall portion 200 from propagating to the sidewall portion 112 of the processing container 101.

Further, in the top wall portion 200, the central flow paths (flow paths 221 and 222) communicating with the flow path 220 are formed inside the central portion of the lower surface 200a surrounded by the protruded portion 210, and the gas holes 227 communicating with the central flow paths are formed in the central portion. As a result, the cleaning gas can be injected from the central portion of the top wall portion 200, and the cleaning gas can be quickly diffused into the processing container 101.

Further, the intervals between the gas holes 226 and 227 are changed so that the plasmarized cleaning gas supplied to the supply port 230 is evenly injected from the gas holes 226 and 227 into the processing container 101. As a result, it is possible to uniformly inject the cleaning gas into the processing container 101.

Further, in the top wall portion 200, the gas holes 226 and 227 are densely arranged on the opposite side of the supply port 230. As a result, it is possible to uniformly inject the cleaning gas into the processing container 101.

Further, the gas holes 226 and 227 are formed to have a large diameter on the lower surface 200a side. As a result, the cleaning gas injected from the gas holes 226 and 227 can be easily diffused, and abnormal discharge in the gas holes 226 and 227 can be suppressed.

According to the present disclosure in some embodiments, it is possible to perform cleaning with remote plasma even when a radiation part for radiating microwaves is arranged on an upper portion of a processing container.

Although the embodiments have been described above, the embodiments disclosed herein should be considered to be exemplary and not limitative in all respects. Indeed, the embodiments described above can be embodied in a variety of forms. Further, the above-described embodiments may be omitted, replaced, or changed in various forms without departing from the scope of the claims and the purpose thereof.

For example, in the above-described embodiments, the case in which the substrate W is a semiconductor wafer has been described by way of example. However, the present disclosure is not limited thereto. The substrate W may be any object.

What is claimed is:

1. A plasma processing apparatus, comprising:
   a processing container in which a stage on which a substrate is placed is accommodated and which includes an opening formed above the stage;
   a lid member configured to seal the opening of the processing container and including:
      a first surface facing an interior of the processing container;
      a second surface facing an exterior of the processing container;
      at least one through-hole formed in a region facing the stage and in which a radiation part configured to radiate microwaves is arranged;
      an annular protruded portion protruding downward from an edge of the lid member and protruding toward the interior of the processing container in a cross section view to surround a central portion of the first surface;
      an annular flow path formed inside the annular protruded portion;
      a plurality of first gas holes formed in the annular protruded portion to be in communication with the annular flow path and open toward the interior of the processing container; and
      a supply port formed in the second surface to be in communication with the annular flow path; and
   a remote plasma unit connected to the supply port and configured to plasmarize a cleaning gas and supply the plasmarized cleaning gas to the supply port.

2. The plasma processing apparatus of claim 1, wherein the first surface of the lid member includes an inclined surface formed in the annular protruded portion to be inclined toward the interior of the processing container with respect to the central portion of the first surface surrounded by the annular protruded portion, and
   the plurality of first gas holes are formed in the inclined surface.

3. The plasma processing apparatus of claim 2, wherein in the lid member, the plurality of first gas holes are formed side by side in at least two directions with respect to the inclined surface.

4. The plasma processing apparatus of claim 3, wherein the lid member includes a stepped portion formed on an inner wall of the flow path on a side of the first surface, and
   the plurality of first gas holes are formed in two directions with respect to the inclined surface so as to penetrate two surfaces constituting the stepped portion.

5. The plasma processing apparatus of claim 4, wherein in the lid member, an angle change of a predetermined angle or more at which a propagation of surface waves is suppressed is made on the first surface.

6. The plasma processing apparatus of claim 5, wherein the first surface of the lid member includes a flat surface connected to an inner surface of the processing container at an angle equal to or larger than a predetermined angle at which a propagation of surface waves is suppressed, with respect to the inner surface.

7. The plasma processing apparatus of claim 6, wherein the lid member includes a central flow path formed inside the central portion of the first surface surrounded by the annular protruded portion to be in communication with the flow path, and a plurality of second gas holes in communication with the central flow path is formed in the central portion.

8. The plasma processing apparatus of claim 7, wherein in the lid member, intervals between the plurality of first gas holes and the plurality of second gas holes are changed so that the plasmarized cleaning gas supplied to the supply port is evenly injected from the plurality of first gas holes and the plurality of second gas holes to the interior of the processing container.

9. The plasma processing apparatus of claim 8, wherein in the lid member, the plurality of first gas holes and the plurality of second gas holes are densely arranged on an opposite side of the supply port.

10. The plasma processing apparatus of claim 9, wherein the plurality of first gas holes and the plurality of second gas holes are formed to have a large diameter on a side of the first surface.

11. The plasma processing apparatus of claim 1, wherein in the lid member, an angle change of a predetermined angle or more at which a propagation of surface waves is suppressed is made on the first surface.

12. The plasma processing apparatus of claim 1, wherein the first surface of the lid member includes a flat surface connected to an inner surface of the processing container at an angle equal to or larger than a predetermined angle at which a propagation of surface waves is suppressed, with respect to the inner surface.

13. The plasma processing apparatus of claim 1, wherein the lid member includes a central flow path formed inside the central portion of the first surface surrounded by the annular protruded portion to be in communication with the flow path, and a plurality of second gas holes in communication with the central flow path is formed in the central portion.

14. The plasma processing apparatus of claim 1, wherein in the lid member, intervals between the plurality of first gas holes are changed so that the plasmarized cleaning gas supplied to the supply port is evenly injected from the plurality of first gas holes to the interior of the processing container.

15. The plasma processing apparatus of claim 1, wherein in the lid member, the plurality of first gas holes are densely arranged on an opposite side of the supply port.

16. The plasma processing apparatus of claim 1, wherein the plurality of first gas holes are formed to have a large diameter on a side of the first surface.

17. A lid member for sealing an opening of a cylindrical processing container in which a stage on which a substrate is placed is accommodated, wherein the opening is formed above the stage, the lid member comprising:
   a first surface facing an interior of the processing container;
   a second surface facing an exterior of the processing container;
   at least one through-hole formed in a region facing the stage and in which a radiation part configured to radiate microwaves is arranged;
   an annular protruded portion protruding downward from an edge of the lid member and protruding toward the interior of the processing container in a cross section view to surround a central portion of the first surface;
   an annular flow path formed inside the annular protruded portion;
   a plurality of gas holes formed in the annular protruded portion to be in communication with the annular flow path and open toward the interior of the processing container; and
   a supply port formed in the second surface to be in communication with the annular flow path.

* * * * *